(12) United States Patent
Sip

(10) Patent No.: US 7,746,090 B1
(45) Date of Patent: Jun. 29, 2010

(54) SYSTEM FOR TESTING CONNECTIONS OF TWO CONNECTORS

(75) Inventor: Kim-Yeung Sip, Shenzhen (CN)

(73) Assignees: Hong Gu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/412,373

(22) Filed: Mar. 27, 2009

(30) Foreign Application Priority Data

Dec. 26, 2008 (CN) .......................... 200810306565

(51) Int. Cl.
*G01R 31/04* (2006.01)
*G01R 31/02* (2006.01)

(52) U.S. Cl. ..................... 324/756; 324/538; 324/758; 324/761; 439/169; 439/489; 702/33

(58) Field of Classification Search .................. 324/538, 324/754–765; 702/33; 439/169, 489
See application file for complete search history.

(56) References Cited

U.S. PATENT DOCUMENTS

| | | | | |
|---|---|---|---|---|
| 5,670,884 A | * | 9/1997 | Kodama | ...................... 324/538 |
| 6,662,119 B1 | * | 12/2003 | Mitchell | ....................... 702/34 |
| 6,768,314 B2 | * | 7/2004 | Shimizu et al. | .............. 324/538 |
| 7,352,289 B1 | * | 4/2008 | Harris | .................... 340/870.07 |
| 7,397,251 B2 | * | 7/2008 | King et al. | ................... 324/538 |
| 2005/0057262 A1 | * | 3/2005 | Kirschenbaum | ............ 324/538 |

* cited by examiner

*Primary Examiner*—Ha Tran T Nguyen
*Assistant Examiner*—Emily Y Chan
(74) *Attorney, Agent, or Firm*—Frank R. Niranjan

(57) ABSTRACT

A system for testing connections of two connectors, each of which includes a pair of verification pins and a number of signal pins, includes a verification testing module, a controlling module, a signal testing module, and a reporting module. The verification testing module is configured for detecting whether each pair of verification pins are electrically connected. The controlling module is configured for allowing communication between each pair of signal pins if the pair of verification pins is detected to be electrically connected. The signal testing module is configured for testing whether each pair of signal pins are electrically connected. The reporting module is configured for reporting the results of the verification testing module and the signal testing module.

10 Claims, 2 Drawing Sheets

SYSTEM FOR TESTING CONNECTIONS OF TWO CONNECTORS

BACKGROUND

1. Technical Field

The disclosure relates to testing of electronic systems, and particularly, to a system for testing connectors.

2. Description of Related Art

In electronic systems, connectors allow data flow across devices or across a device and its peripherals. A typical connector includes a number of verification pins and a number of signal pins. The verification pins are configured for verifying whether two connectors are a matching pair. During initialization of the electronic systems, testing of the connections between devices or between the device and the peripheral is performed. Current systems for testing connectors only detect whether each pair of verification pins of each of the two connected connectors are electrically connected. If the verification pins are deemed to be electrically connected, the testing of the two connectors is considered as passed. However, it is not uncommon that other pins of the two matching connectors may not be electrically connected, even when electrical connection of each pair of verification pins has been detected. Thus the current testing process would not guarantee the flow of the data across the connection.

Therefore, it is desirable to provide a system for testing connections of two connectors, which can overcome the limitations described above.

DETAILED DESCRIPTION

Figure 1:
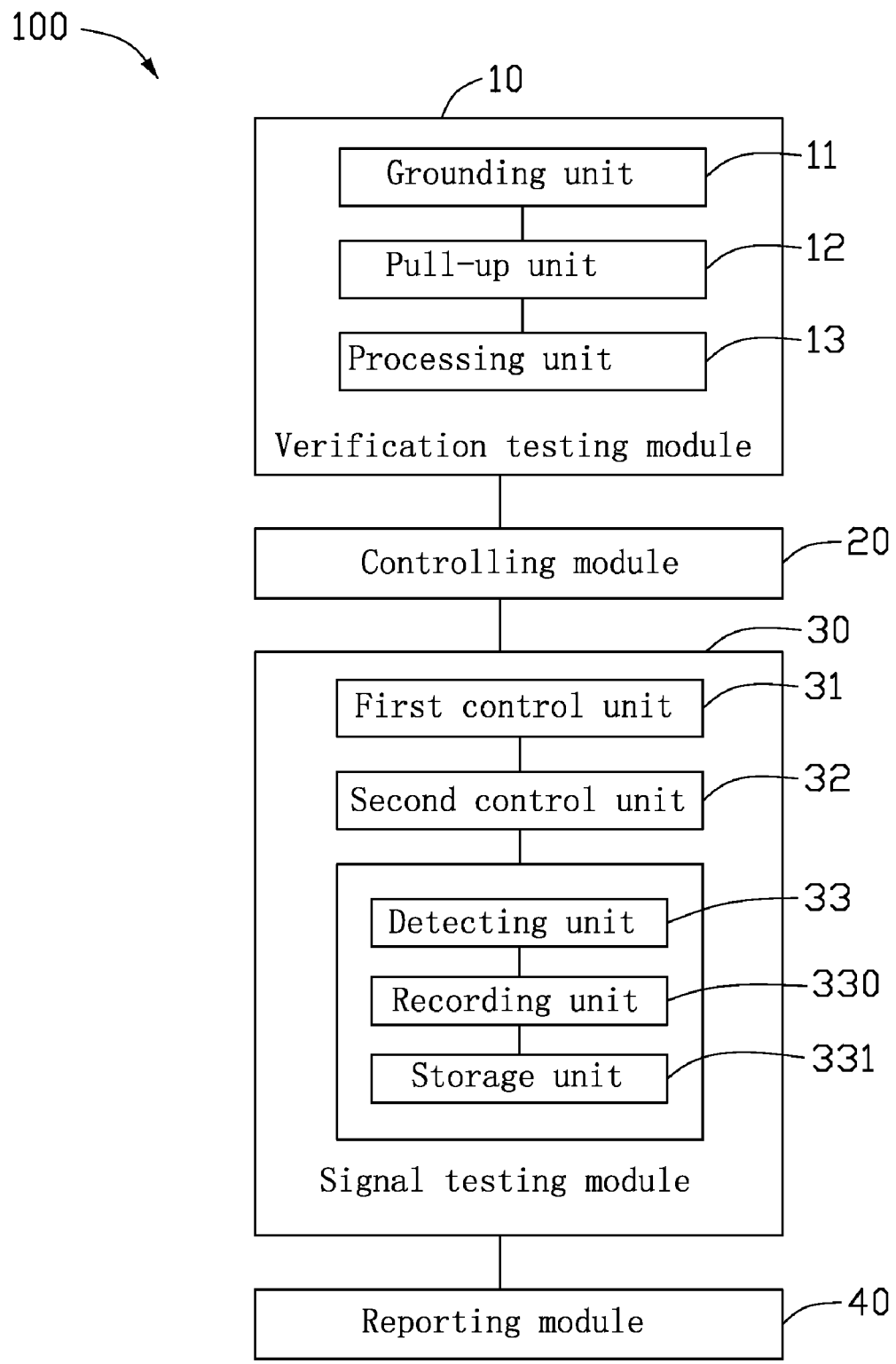
FIG. 1 is functional block diagram of a system for testing connections of two connectors, according to an exemplary embodiment.
Figure 2:
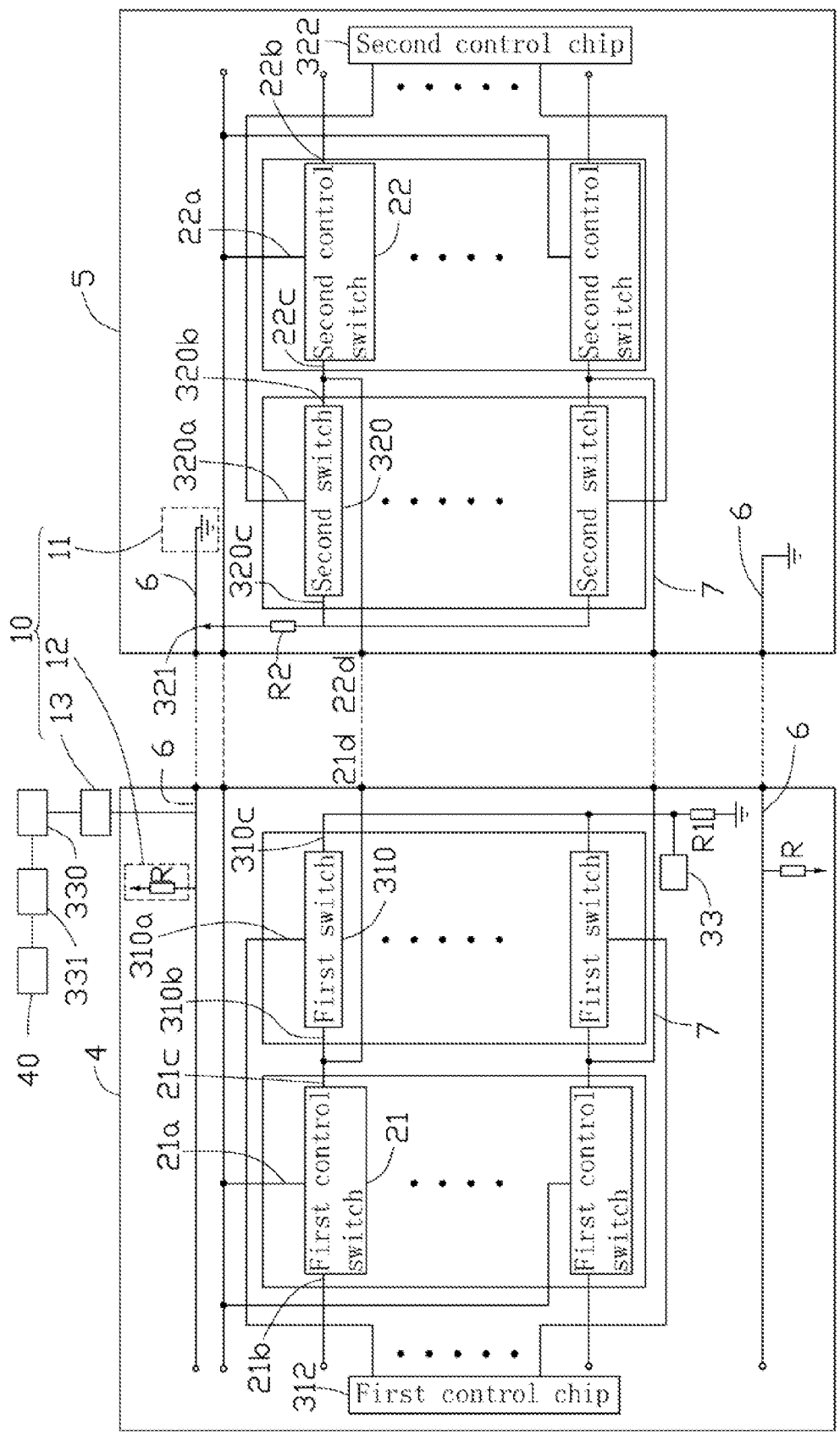
FIG. 2 is a circuit diagram of the system of FIG. 1.

Referring to FIGS. 1 and 2, a system 100 for fully testing connections of two connectors 4, 5, according to an exemplary embodiment, is disclosed. Each of the two connectors 4, 5 includes two verification pins 6 and a number of signal pins 7. In this embodiment, the connector 4 is a male connector and the connector 5 is a female connector. Accordingly, the pins 6, 7 of the connector 4 are male pins and the pins 6, 7 of the connector 5 are female pins. It can be understood that the roles of the connectors 4, 5 is not limited to this embodiment but can be interchanged in other alternative embodiments. Also, the number of the verification pins 6 is not limited to this embodiment, but depends on the type of the connectors 4, 5. For example, in other alternative embodiments, each of the connectors 4, 5 may only include only one verification pin 6.

The verification pins 6 are configured for identifying whether the two connectors 4, 5 are a matching pair. In theory, if the two connectors 4, 5 are a matching pair, when the two connectors 4, 5 are coupled together, the verification pins 6 correspondingly form electrical connections and data and/or electrical signals can be transmitted between the connectors 4, 5. The signal pins 7 are configured for transmitting data/signals between the connectors 4, 5. In theory, if the two connectors 4, 5 are a matching pair and coupled together, the signal pins 7 of the connector 4 and the signal pins 7 of the connector 5 will be electrically connected to each other correspondingly. In reality, it is not uncommon for the connector 4 and the connector 5 to be coupled, yet corresponding verification pins 6 and signal pins 7 might be electrically disconnected from each other correspondingly due to, for example, oxidation. Therefore, each pin must be tested for electrical connectivity.

The system 100 includes a verification testing module 10, a controlling module 20, a signal testing module 30, and a reporting module 40.

The verification testing module 10 is configured for testing whether the verification pins 6 of the connector 4 are electrically coupled to the corresponding verification pins 6 of the connector 5. In this embodiment, the verification testing module 10 includes a grounding unit 11, a pull-up unit 12, and a processing unit 13. The grounding unit 11 is configured for connecting the verification pins 6 of the connector 5 to ground. The pull-up unit 12 is configured for pulling the voltage of the verification pins 6 of the connector 4 to "1" (high voltage). However, this pulling is intentionally weak enough that if the verification pin 6 of the connector 4 is electrically coupled to the verification pin 6 of the connector 5, the voltage of the verification pin 6 of the connector 4 will go to "0" (low voltage level). Therefore, whether each pair of the verification pins 6 of the connector 4 is electrically connected to the verification pins 6 of the connector 5 can be determined by measuring the voltage level of the verification pins 6 of the connector 4. The processing unit 13 is configured for measuring the voltage level of the verification pins 6 of the connector 4 and outputting the results. In this embodiment, the results may be "00", "01", "10", and "11". Only result "00" indicates the two pairs of verification pins 6 of the connectors 4 are electrically connected to the corresponding verification pins 6 of the connector 5. In this embodiment, the pull-up unit 12 includes a first pull-up resistor R. Typically, the pull-up resistor R has high resistance.

The controlling module 20 is configured for enabling communications between the signal pins 7 of the connector 4 and the corresponding pins 7 of the connector 5, if the verification pins 6 of the connectors 4, 5 have been detected to be electrically coupled to each other, to allow testing of the signal pins 7. In detail, the controlling module 20 includes a number of first control switches 21 and a number of second control switches 22. Each first control switch 21 includes a first control terminal 21a, a first signal terminal 21b, and a first output terminal 21c. The first control terminals 21a are connected to the verification testing module 10. The first signal terminals 21b are connected to inputs of the connector 4. Each first output terminals 21c forms two branches. One branch is connected to the signal testing module 30, and another branch forms a first port 21d of the corresponding signal pin 7 of the connector 4. Each second control switch 22 includes a second control terminal 22a, a second signal terminal 22b, and a second output terminal 22c. The second control terminals 22a are connected to the verification testing module 10. The second signal terminals 22b are connected to the inputs of the connector 5. Each second output terminal 22c forms two branches. One branch is connected to the signal testing module 30, and another branch forms a second port 22d of the corresponding signal pin 7 of the connector 5. As such, if the connectors 4, 5 have been electrically connected to each other, and both the first control terminal 21a and the second control terminal 22a are "1", the first signal terminal 21b and the first output terminal 21c are connected to each other, and the second signal terminal 22b and the second output terminal 22c are connected to each other.

The signal testing module 30 is connected to the controlling module 20 and is configured for detecting the voltage level of the signal pins 7 sequentially when the connectors 4, 5 are connected to each other and communications therebetween are allowed (i.e., testing of the signal pins 7 is allowed).

The signal testing module 30 includes a first control unit 31, a second control unit 32, and a detecting unit 33.

The first control unit 31 includes a number of first switches 310 and a first control chip 312. The first control chip 312 is connected to the first switches 310 and to the electrical ground via a pull-down resistor R1. In detail, the first control chip 312 includes a number of control pins. Each first switch 310 includes a third control terminal 310a, a third signal terminal 310b, and a pull-down terminal 310c. The third control terminals 310a are connected to the corresponding control pins of the first control chip 312. The third signal terminals 310b are connected to corresponding first output terminals 21c. The pull-down terminals 310c are connected to the pull-down resistor R1. When a third control terminal 310a gets "1", the corresponding third signal terminal 310b and the pull-down terminal 310c are connected to electrically ground the corresponding signal pin 7. When a third control terminal gets "0", the corresponding third signal terminal 310b and the pull-down terminal 310c are electrically disconnected.

The second control unit 32 includes a number of second switches 320 and a second control chip 322. The second control chip 322 is connected to the second switches 320 and connected to a power source 321 via a second pull-up resistor R2. In detail, the second control chip 322 includes a number of control pins. Each second switch 320 includes a fourth control terminal 320a, a fourth signal terminal 320b, and a pull-up terminal 320c. The fourth control terminals 320a are connected to the corresponding control pins of the second control chip 322. The fourth signal terminals 320b are connected to the corresponding second output terminals 22c. The pull-up terminals 320c are connected to the second pull-up resistor R2. When a fourth control terminal 320a gets "1", the corresponding fourth signal terminal 320b and the pull-up terminal 320c are connected to pull the corresponding signal pin 7 of the connector 5 to "1". When a fourth control terminals 320a gets "0", the corresponding fourth signal terminal 320b and the pull-up terminal 320c are disconnected.

The first control chip 312 and the second control chip 322 are programmable chips, both having a sequence control circuit. The sequence control circuit is configured for controlling the control pins to output "1" in sequence to a corresponding third control terminal 310a and fourth control terminal 320a.

The detecting unit 33 interconnects the first switches 310 and the pull-down resistor R1 and is configured for detecting whether each pair of signal pins 7 are electrical connected. In principle, when communications of all pairs of signal pins 7 are enabled (i.e., all first signal terminals 21b are connected to the corresponding first output terminal 21c and all second signal terminals 22b are connected to the corresponding second output terminal 22c) and a pair of signal pins 7 is under testing (i.e., the corresponding third signal terminals 310b are connected to the corresponding pull-down terminal 21c and the fourth signal terminals 320b are connected to the corresponding pull-up terminal 320c), if the pair of signal pins 7 are electrically connected, the detecting unit 33 would yields "1". Otherwise, connection of the pair of signal pins 7 is broken.

The signal testing module 30 further includes a recording unit 330 and a storage unit 331. The recording unit 330 is configured for recording the result of the processing unit 13 and detecting unit 33. The storage unit 331 is configured for storing the records of the recording unit 330.

The reporting module 40 is configured for reading records of testing from the storage unit 331 and outputting the records to users.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for testing connections of two connectors, each connector comprising a verification pin and a plurality of signal pins, the system comprising:
   a verification testing module configured for detecting whether the verification pin of one connector is electrically connected to the verification pin of the other connector;
   a controlling module configured for allowing testing of the signal pins if the pair of verification pins are detected electrically connected to each other;
   a signal testing module comprising:
      a first control unit configured to sequentially pull each of the signal pins of one connector down to ground;
      a second control unit configured to electrically pull a signal pin of the other connector corresponding to the signal pin which is pulled down to ground up to a high voltage level; and
      a detecting unit configured for detecting the voltage level of the signal pins which is pulled down; and
   a reporting module configured for reporting the results of the verification testing module and the detecting unit.

2. The system as claimed in claim 1, wherein the verification testing module comprises:
   a grounding unit configured for connecting the verification pin of one connector to ground;
   a pull-up unit configured for pulling the verification pin of the other connector up to a high voltage; and
   a processing unit configured for measuring the voltage of the verification pin pulled up by the pull-up unit.

3. The system as claimed in claim 2, wherein the pull-up unit comprises a pull-up resistor.

4. The system as claimed in claim 1, wherein the controlling module comprises a plurality of first control switches and a plurality of second control switches,
   each first control switch comprising a first control terminal, a first signal terminal, and a first output terminal,
   the first control terminals being connected to the verification testing module,
   the first signal terminals being connected to the corresponding signal pins of one connector,
   each first output terminals forming two branches, one branch being connected to the signal testing module, and another branch forming a first port of the corresponding signal pin of the connector;
   each second control switch comprising a second control terminal, a second signal terminal, and a second output terminal,
   the second control terminals being connected to the verification testing module,
   the second signal terminals being connected to the corresponding signal pins of the other connector,
   each second output terminal forming two branches, one branch being connected to the signal testing module, and another branch forming a second port of the corresponding signal pin of the other connector.

5. The system as claimed in claim 4, wherein the first control unit comprises a plurality of first switches and a first control chip, the first control chip being connected to the first switches and to the electrical ground via a pull-down resistor.

6. The system as claimed in claim 5, wherein the first control chip comprises a plurality of control pins,
  each first switch comprising a third control terminal, a third signal terminal, and a pull-down terminal,
  the third control terminals being connected to the corresponding control pins of the first control chip,
  the third signal terminals being connected to corresponding first output terminals,
  the pull-down terminals being connected to the pull-down resistor.

7. The system as claimed in claim 4, wherein the second control unit comprises a plurality of second switches and a second control chip, the second control chip being connected to the second switches and connected to a high voltage level terminal via a second pull-up resistor.

8. The system as claimed in claim 7, wherein the second control chip comprises a plurality of control pins,
  each second switch comprising a fourth control terminal, a fourth signal terminal, and a pull-up terminal,
  the fourth control terminals being connected to the corresponding control pins of the second control chip,
  the fourth signal terminals being connected to the corresponding second output terminals,
  the pull-up terminals being connected to the second pull-up resistor.

9. The system as claimed in claim 1, wherein the signal testing module further comprises a recording unit, the recording unit being configured for recording the results of the verification testing module and the detecting unit.

10. The system as claimed in claim 9, wherein the signal testing module further comprises a storage unit, the storage unit being configured for storing the records of the recording unit.

* * * * *

UNITED STATES PATENT AND TRADEMARK OFFICE
CERTIFICATE OF CORRECTION

PATENT NO. : 7,746,090 B1
APPLICATION NO. : 12/412373
DATED : June 29, 2010
INVENTOR(S) : Kim-Yeung Sip It is certified that error appears in the above-identified patent and that said Letters Patent is hereby corrected as shown below:

On the title page item (73), should read:

--Hong Fu Jin Precision Industry (ShenZhen) Co., Ltd., Shenzhen, Guangdong Province (CN); Hon Hai Precision Industry Co., Ltd., Tu-Cheng, Taipei Hsien (TW).--

Signed and Sealed this
Fourth Day of January, 2011

David J. Kappos
*Director of the United States Patent and Trademark Office*